(12) United States Patent
Jain et al.

(10) Patent No.: US 12,531,556 B1
(45) Date of Patent: Jan. 20, 2026

(54) GATE DRIVER

(71) Applicant: Infineon Technologies Austria AG, Villach (AT)

(72) Inventors: Abhishek Jain, Delhi (IN); Ramesh Karpur Gopinathan, Bengaluru (IN); Suraj Somashekara Kumar, Dakshina Kannada (IN); Ashutosh Ravindra Joharapurkar, Bengaluru Rural (IN)

(73) Assignee: Infineon Technologies Austria AG, Villach (AT)

( * ) Notice: Subject to any disclaimer, the term of this patent is extended or adjusted under 35 U.S.C. 154(b) by 21 days.

(21) Appl. No.: 18/769,112

(22) Filed: Jul. 10, 2024

(51) Int. Cl.
*H03K 17/16* (2006.01)
*H03H 7/01* (2006.01)
*H03H 7/06* (2006.01)

(52) U.S. Cl.
CPC ......... *H03K 17/162* (2013.01); *H03H 7/0153* (2013.01); *H03H 7/06* (2013.01)

(58) Field of Classification Search
CPC .................................................. H03K 17/162
USPC ........................................................ 327/109
See application file for complete search history.

(56) References Cited

U.S. PATENT DOCUMENTS 11,706,056 B2 * 7/2023 Nuebling ................. H04B 5/22
375/258

* cited by examiner

*Primary Examiner* — Tomi Skibinski
(74) *Attorney, Agent, or Firm* — Cooper Legal Group LLC

(57) ABSTRACT

According to some embodiments, a receiver comprises a positive terminal, a negative terminal, a first isolation capacitor connected to the positive terminal, a second isolation capacitor connected to the negative terminal, a resistor circuit connected to the first isolation capacitor and the second isolation capacitor to define a first high pass filter, an amplifier connected to the first high pass filter, a level detector connected to the amplifier, and a second high pass filter connected between the first high pass filter and the level detector.

20 Claims, 4 Drawing Sheets

GATE DRIVER

TECHNICAL FIELD

The present disclosure relates generally to electronic circuits, and, more particularly, to a gate driver that reduces noise from component mismatch.

BACKGROUND

A power semiconductor device comprises a semiconductor structure configured to conduct a load current along a load current path between two load terminal structures of the device. The load current path may be controlled by a gate driver than enables a gate electrode of the power semiconductor device.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a bridge driver comprises a high side input terminal, a transmitter, a receiver, and a high side driver. The transmitter is configured to generate a modulated signal based on a high side input signal received at the high side input terminal. The modulated signal comprises a positive differential component and a negative differential component. The receiver comprises an isolation circuit connected to the transmitter to receive the positive differential component and the negative differential component, an amplifier connected to the isolation circuit to amplify the positive differential component to generate an amplified positive differential component and to amplify the negative differential component to generate an amplified negative differential component, a level detector connected to the amplifier to generate a driver signal based on the amplified positive differential component and the amplified negative differential component, and a high pass filter connected between the isolation circuit and the level detector and configured to reduce noise generated in the isolation circuit such that the driver signal is a function of a filtered version of the amplified positive differential component and a filtered version of the amplified negative differential component. The high side driver is connected to the level detector and is configured to generate a high side output signal based on the driver signal.

According to some embodiments, a receiver comprises a positive terminal, a negative terminal, a first isolation capacitor connected to the positive terminal, a second isolation capacitor connected to the negative terminal, a resistor circuit connected to the first isolation capacitor and the second isolation capacitor to define a first high pass filter, an amplifier connected to the first high pass filter, a level detector connected to the amplifier, and a second high pass filter connected between the first high pass filter and the level detector.

According to some embodiments, a method comprises generating a modulated signal based on a high side input signal, the modulated signal comprising a positive differential component and a negative differential component, receiving the positive differential component at a first isolation capacitor, receiving the negative differential component at a second isolation capacitor, filtering, in a first high pass filter defined by a resistor circuit connected to the first isolation capacitor and the second isolation capacitor, the positive differential component and the negative differential component to generate a first filtered positive differential component and a first filtered negative differential component, filtering, in a second high pass filter, the first filtered positive differential component and the first filtered negative differential component to generate a second filtered positive differential component and a second filtered negative differential component, generating, in a level detector, a driver signal based on the second filtered positive differential component and the second filtered negative differential component, and generating, in a high side driver, a high side output signal based on the driver signal.

According to some embodiments, a system comprises means for generating a modulated signal based on a high side input signal, the modulated signal comprising a positive differential component and a negative differential component, means for receiving the positive differential component at a first isolation capacitor, means for receiving the negative differential component at a second isolation capacitor, means for filtering, in a first high pass filter defined by a resistor circuit connected to the first isolation capacitor and the second isolation capacitor, the positive differential component and the negative differential component to generate a first filtered positive differential component and a first filtered negative differential component, means for filtering, in a second high pass filter, the first filtered positive differential component and the first filtered negative differential component to generate a second filtered positive differential component and a second filtered negative differential component, means for generating, in a level detector, a driver signal based on the second filtered positive differential component and the second filtered negative differential component, and means for generating, in a high side driver, a high side output signal based on the driver signal.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
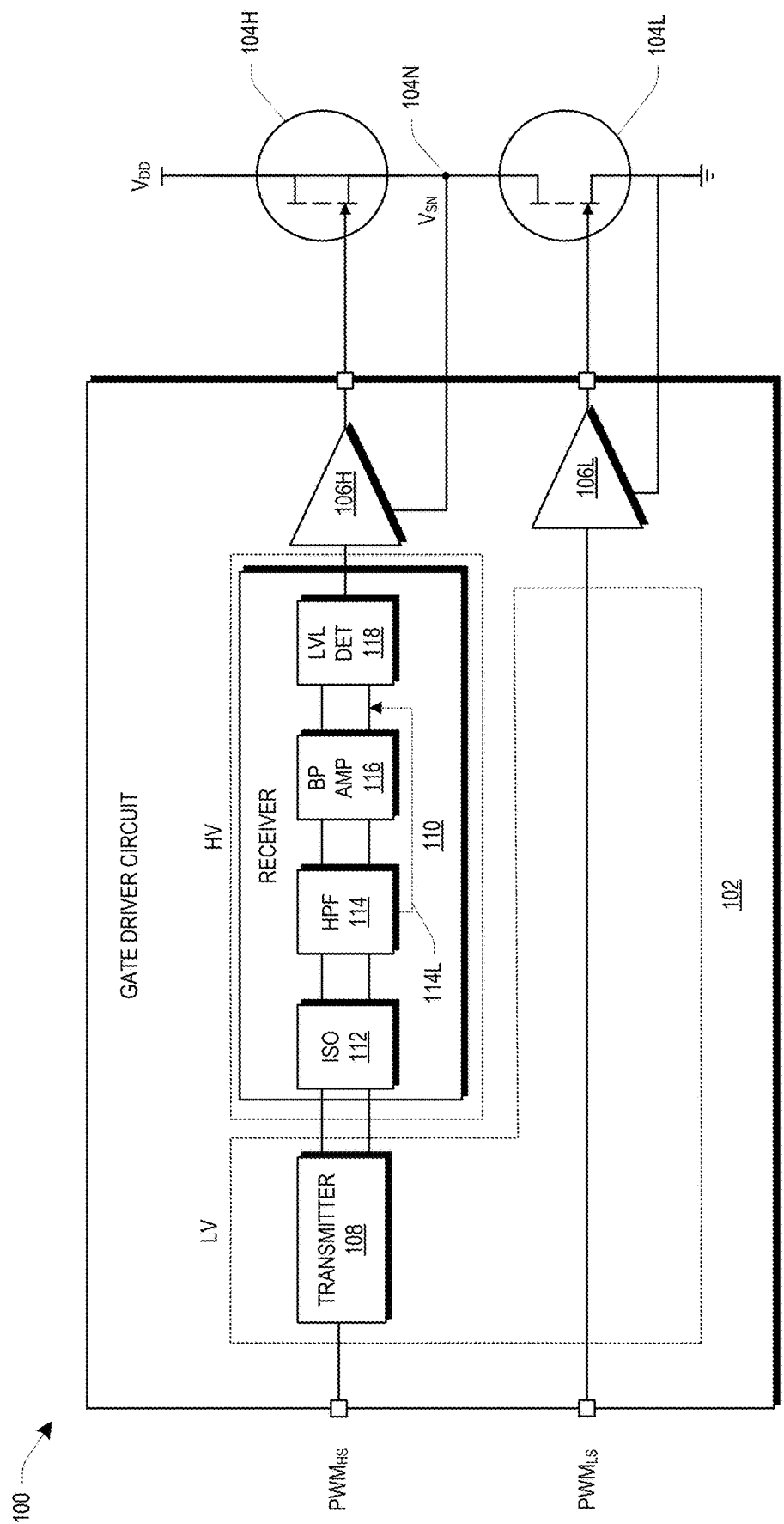
FIG. 1 is a schematic diagram of a load powering circuit, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Gate driver circuits are used to control power semiconductor devices to enable load current to be controlled. Example applications include motor controls, inverters, power supplies, voltage converters, or some other application. In some embodiments, a load driving circuit comprises a high side power switch and a low side power switch connected at a node. The high side power switch is controlled by a high side gate driver in a high voltage domain referenced to a high voltage power supply and the low side power switch is controlled by a low side gate driver in a low voltage domain referenced to a reference voltage (e.g., ground). Pulse width modulation signals for controlling the gate drivers are generated in the low voltage domain. An isolation circuit includes a transmitter in the low voltage domain and a receiver including an isolation circuit that isolates the low voltage domain from the high voltage domain. To increase sensitivity, the transmitter and the receiver may use differential signals that are received in a level detector that generates a single ended output for the gate driver. However, process variation can cause mismatches in the positive and negative differential signal paths of the isolation circuit which introduces noise in the received signal. In some embodiments, the receiver includes a high pass filter between the isolation circuit and the level detector to reduce mismatch noise and reduce the likelihood of false level detections.

Referring to FIG. 1 a schematic diagram of a load powering circuit 100 is provided, according to some embodiments. In some embodiments, the load powering circuit 100 comprises a gate driver circuit 102 for controlling a high side switch 104H and a low side switch 104L connected at a switching node 104N. The gate driver circuit 102 comprises a high side gate driver 106H for controlling the high side switch 104H and a low side gate driver 106L for controlling the low side switch 104L. Low voltage pulse width modulation signals, $PWM_{HS}$ and $PWM_{LS}$, are provided to control the high side gate driver 106H and the low side gate driver 106L, respectively. The low side gate driver 106L is also in the low voltage domain and the low side $PWM_{LS}$ signal is provided directly to the low side gate driver 106L. The high side gate driver 106H is powered by the high voltage power supply ($V_{DD}$) (e.g., up to approximately 650V) that powers a load attached to the load powering circuit 100. A transmitter 108 in the low voltage domain receive the high side $PWM_{HS}$ signal and transmits the signal to a receiver 110 in the high voltage domain. The receiver 110 isolates the high voltage domain from the low voltage domain. In some embodiments, the high side switch 104H and the low side switch 104L comprise GaN transistors. The ground reference of the high side gate driver 106H is connected to the switching node 102N to limit the gate-to-source-voltage of the high side switch 104H (e.g., limited to about 6-7V).

In some embodiments, the receiver 110 comprise an isolation circuit 112 (ISO), a high pass filter 114 (HPF) connected to the isolation circuit 112, a bandpass amplifier 116 (BP AMP) connected to the high pass filter 114, and a level detector 118 (LVL DET) connected to the bandpass amplifier 116. In some embodiments, the high pass filter 114 is provided between the bandpass amplifier 116 and the level detector 118 rather than between the isolation circuit 112 and the bandpass amplifier 116 as indicated by the dashed line 114L.

In some embodiments, the isolation circuit 112 blocks the high voltage seen by the high side gate driver 106H from the low voltage associated with the transmitter 108. The voltage, $V_{SN}$, at the switching node 102N between the high side switch 102H and the low side switch 102L changes from $V_{DD}$ when the high side switch 102H is closed to ground when the low side switch 102L is closed. The switching of the voltage, $V_{SN}$, at the switching node 102N represents a common node transient event that generates noise in the isolation circuit 112. The high pass filter 114 reduces noise from the common mode transient event that is seen in the output of the isolation circuit 112. The bandpass amplifier 116 amplifies and filters the differential signal output generated by the high pass filter 114 to improve detectability. The level detector 118 may include a level shifter to generate a single ended level signal based on the amplified differential signal generated by the bandpass amplifier 116 that represents the high or low value of the $PWM_{HS}$ signal and a driver circuit to generate a drive signal for the high side gate driver 106H.

Figure 2:
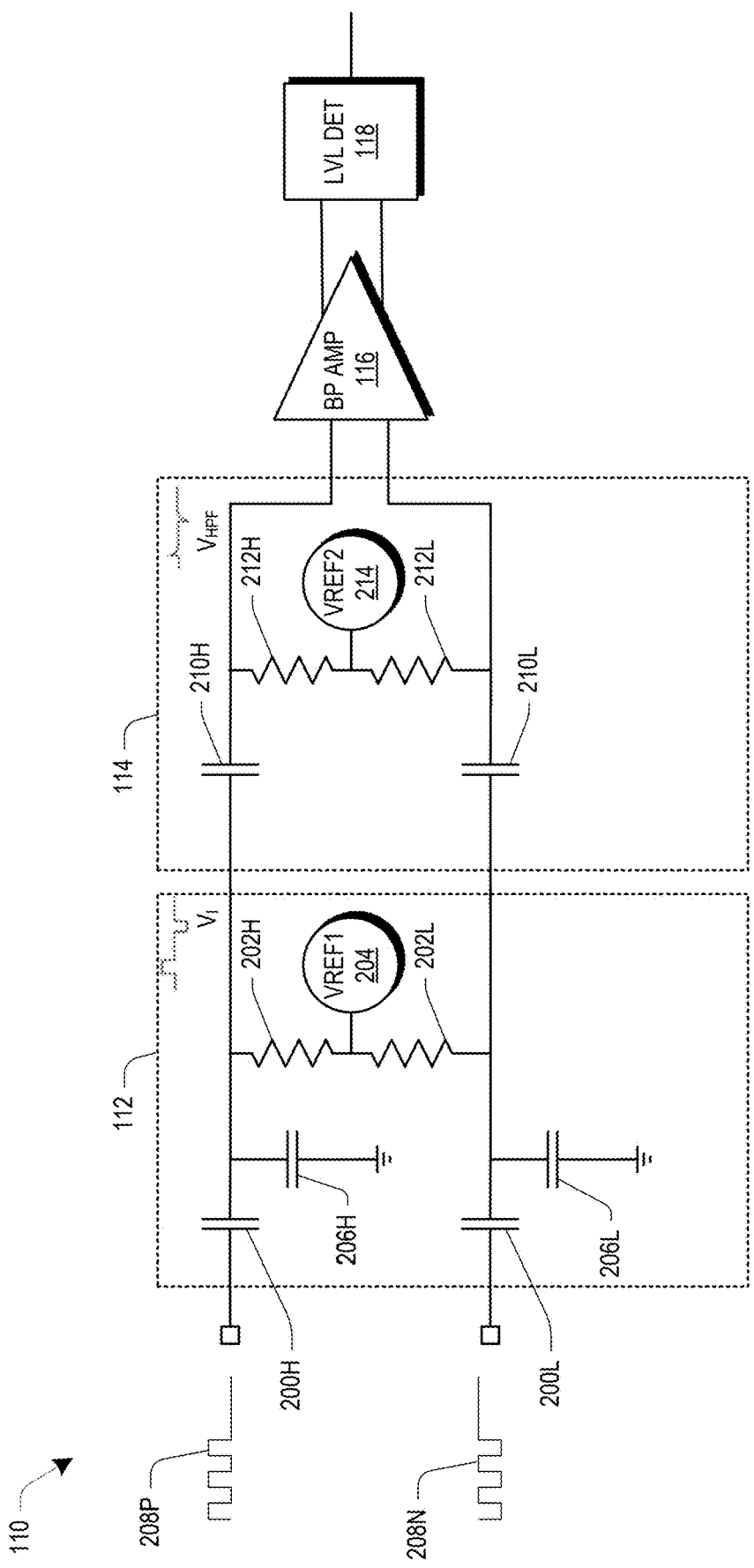
FIG. 2 is a diagram of a receiver, according to some embodiments.

FIG. 2 is a schematic diagram of the receiver 110, according to some embodiments. In some embodiments, the isolation circuit 112 comprises isolation capacitors 200H, 200L, resistors 202H, 202L connected to the isolation capacitors 200H, 200L, and a reference voltage source 204 connected to a node between the resistors 202H, 202L. Capacitors 206H, 206L represent parasitic capacitances of the differential signal paths. Process variation can cause mismatches between parameter values of one or more of the capacitors 200H, 200L, the resistors 202H, 202L, or the capacitors 206H, 206L. This mismatch causes noise to be generated from the common mode transient event. In some embodiments, the transmitter 108 sends a differential signal corresponding to the $PWM_{HS}$ signal. In some embodiments, the transmitter 108 employs on-off keying modulation where the differential signal is periodic (e.g., a square wave) during time intervals that the $PWM_{HS}$ signal is high and level during time intervals that the $PWM_{HS}$ signal is low. The differential signal may comprise a positive component 208P and a negative component 208N.

In some embodiments, the high pass filter 114 comprises capacitors 210H, 210L, resistors 212H, 212L connected to the capacitors 210H, 210L, and a reference voltage source 214 connected to a node between the resistors 212H, 212L. In some embodiments, the reference voltage source 204 and the reference voltage source 214 provide different reference voltages, REF1 and REF2, respectively.

Figure 3:
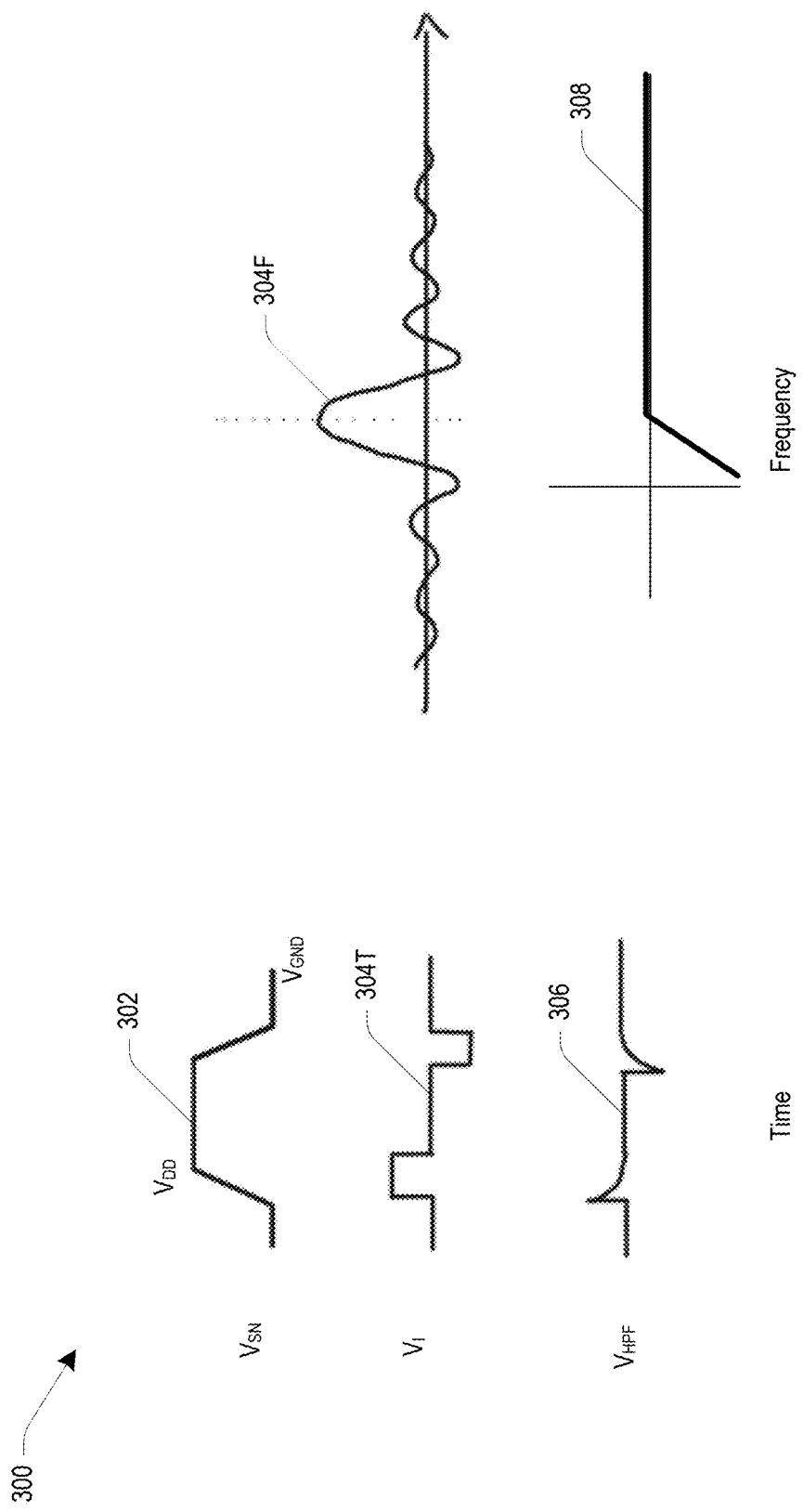
FIG. 3 is a diagram illustrating waveforms in the load powering circuit, according to some embodiments.

FIG. 3 is a diagram 300 illustrating waveforms in the load powering circuit 100, in accordance with some embodiments. A waveform 302 represents the voltage, $V_{SN}$, at the switching node 102N that provides the ground reference for the high side gate driver 106H which changes from $V_{DD}$ when the high side switch 102H is closed to ground when the low side switch 102L is closed. The switching of the voltage, $V_{SN}$, at the node represents a common node transient event that generates a noise signal, $V_I$, at the isolation capacitors 200H, 200L as shown by a waveform 304T in the time domain and a waveform 304F in the frequency domain. The frequency domain waveform is a sinc function centered at 0 Hz. The high pass filter 114 reduces noise generated in the isolation circuit 112 from the common mode transient event as represented in the waveform 306 that shown the output signal, $V_{HPF}$, from the noise of the high pass filter 114. A waveform 308 shows the frequency response of the high pass filter 114, which is removes most of the noise from the sinc function shown in the waveform 304F.

Figure 4:
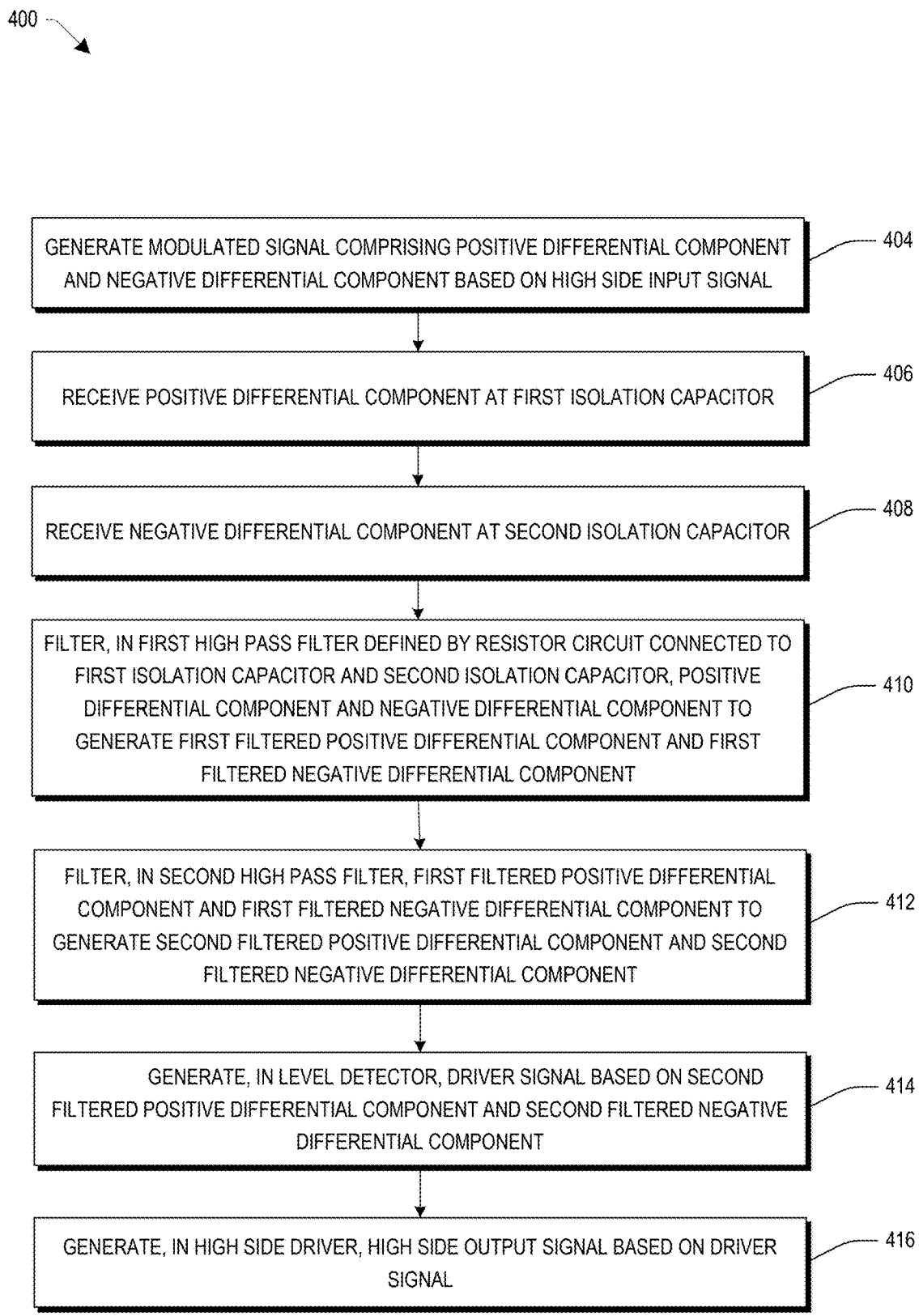
FIG. 4 illustrates a method of controlling a load powering circuit, in accordance with some embodiments.

FIG. 4 illustrates a method 400 of controlling a load powering circuit 100, in accordance with some embodiments. At 402, a low side output signal is generated in a low side driver based on a low side input signal. At 404, a modulated signal is generated based on a high side input signal. The modulated signal comprises a positive differential component and a negative differential component. At 406, the positive differential component is received at a first isolation capacitor. At 408, the negative differential component is received at a second isolation capacitor. At 410, the positive differential component and the negative differential component are filtered in a first high pass filter defined by a resistor circuit connected to the first isolation capacitor and the second isolation capacitor to generate a first filtered positive differential component and a first filtered negative differential component. At 412, the first filtered positive differential component and the first filtered negative differential component are filtered in a second high pass filter to generate a second filtered positive differential component and a second filtered negative differential component. At 414, a driver signal is generated in a level detector based on the second positive differential component and the second negative differential component. At 416, a high side output signal is generated in a high side driver based on the driver signal.

According to some embodiments, a bridge driver comprises a high side input terminal, a transmitter, a receiver, and a high side driver. The transmitter is configured to generate a modulated signal based on a high side input signal received at the high side input terminal. The modulated signal comprises a positive differential component and a negative differential component. The receiver comprises an isolation circuit connected to the transmitter to receive the positive differential component and the negative differential component, an amplifier connected to the isolation circuit to amplify the positive differential component to generate an amplified positive differential component and to amplify the negative differential component to generate an amplified negative differential component, a level detector connected to the amplifier to generate a driver signal based on the amplified positive differential component and the amplified negative differential component, and a high pass filter connected between the isolation circuit and the level detector and configured to reduce noise generated in the isolation circuit such that the driver signal is a function of a filtered version of the amplified positive differential component and a filtered version of the amplified negative differential component. The high side driver is connected to the level detector and is configured to generate a high side output signal based on the driver signal.

According to some embodiments, the high pass filter is connected between the isolation circuit and the amplifier, or the high pass filter is connected between the amplifier and the level detector.

According to some embodiments, the bridge driver comprises a low side input terminal and a low side driver connected to the low side input terminal and configured to generate a low side output signal based on a low side input signal received at the low side input terminal, wherein the transmitter and the low side driver are in a low voltage domain and the receiver and the high side driver are in a high voltage domain.

According to some embodiments, the amplifier comprises a bandpass amplifier.

According to some embodiments, the isolation circuit comprises a first isolation capacitor connected to receive the positive differential component, a second isolation capacitor connected to receive the negative differential component, a first resistor connected to the first isolation capacitor, a second resistor connected to the second isolation capacitor and the first resistor, and a reference voltage source connected to a node between the first resistor and the second resistor.

According to some embodiments, the high pass filter comprises a first isolation capacitor, a second isolation capacitor, a first resistor connected to the first isolation capacitor, a second resistor connected to the second isolation capacitor and the first resistor, and a reference voltage source connected to a node between the first resistor and the second resistor.

According to some embodiments, the level detector comprises a level shifter circuit, and a detector circuit connected to the level shifter circuit.

According to some embodiments, the transmitter is configured to generate the modulated signal using on-off keying modulation.

According to some embodiments, a receiver comprises a positive terminal, a negative terminal, a first isolation capacitor connected to the positive terminal, a second isolation capacitor connected to the negative terminal, a resistor circuit connected to the first isolation capacitor and the second isolation capacitor to define a first high pass filter, an amplifier connected to the first high pass filter, a level detector connected to the amplifier, and a second high pass filter connected between the first high pass filter and the level detector.

According to some embodiments, the second high pass filter is connected between the first high pass filter and the amplifier, or the second high pass filter is connected between the amplifier and the level detector.

According to some embodiments, the resistor circuit comprises a first resistor connected to the first isolation capacitor, and a second resistor connected between the second isolation capacitor and the first resistor.

According to some embodiments, the resistor circuit comprises a reference voltage source connected to a node between the first resistor and the second resistor.

According to some embodiments, the amplifier comprises a bandpass amplifier.

According to some embodiments, the second high pass filter comprises a third isolation capacitor, a fourth isolation capacitor, a first resistor connected to the third isolation capacitor, a second resistor connected between the fourth isolation capacitor and the first resistor, and a reference voltage source connected to a node between the first resistor and the second resistor.

According to some embodiments, the level detector comprises a level shifter circuit, and a detector circuit connected to the level shifter circuit.

According to some embodiments, a method comprises generating a modulated signal based on a high side input signal, the modulated signal comprising a positive differential component and a negative differential component, receiving the positive differential component at a first isolation capacitor, receiving the negative differential component at a second isolation capacitor, filtering, in a first high pass filter defined by a resistor circuit connected to the first isolation capacitor and the second isolation capacitor, the positive differential component and the negative differential component to generate a first filtered positive differential component and a first filtered negative differential component, filtering, in a second high pass filter, the first filtered positive differential component and the first filtered negative differential component to generate a second filtered positive differential component and a second filtered negative differential component, generating, in a level detector, a driver signal based on the second filtered positive differential component and the second filtered negative differential component, and generating, in a high side driver, a high side output signal based on the driver signal.

According to some embodiments, the method comprises amplifying the first filtered positive differential component and the first filtered negative differential component to generate an amplified positive differential component and an amplified negative differential component, wherein filtering, in the second high pass filter, comprises filtering the amplified positive differential component and the amplified negative differential component to generate the second filtered positive differential component and the second filtered negative differential component.

According to some embodiments, the method comprises amplifying the second filtered positive differential component and the second filtered negative differential component prior to generating the driver signal.

According to some embodiments, the method comprises providing the resistor circuit comprising a first resistor connected to the first isolation capacitor, a second resistor connected to the second isolation capacitor and the first resistor, and a reference voltage source connected to a node between the first resistor and the second resistor.

According to some embodiments, the method comprises providing the second high pass filter comprising a third isolation capacitor connected to the first isolation capacitor, a first resistor connected to the third isolation capacitor, a fourth isolation capacitor connected to the second isolation capacitor, a second resistor connected to the fourth isolation capacitor and the first resistor, and a reference voltage source connected to a node between the first resistor and the second resistor.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" and/or the like is used herein to mean serving as an example, instance, illustration, etc., and not necessarily as advantageous. Rather, use of the word "example" and/or the like is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A bridge driver, comprising:
a high side input terminal;
a transmitter configured to generate a modulated signal based on a high side input signal received at the high side input terminal, the modulated signal comprising a positive differential component and a negative differential component;
a receiver, comprising:
  an isolation circuit connected to the transmitter to receive the positive differential component and the negative differential component;
  an amplifier connected to the isolation circuit to amplify the positive differential component to generate an amplified positive differential component and to amplify the negative differential component to generate an amplified negative differential component;
  a level detector connected to the amplifier to generate a driver signal based on the amplified positive differential component and the amplified negative differential component; and
  a high pass filter connected between the isolation circuit and the level detector and configured to reduce noise generated in the isolation circuit such that the driver signal is a function of a filtered version of the amplified positive differential component and a filtered version of the amplified negative differential component; and
a high side driver connected to the level detector and configured to generate a high side output signal based on the driver signal.

2. The bridge driver of claim 1, wherein:
the high pass filter is connected between the isolation circuit and the amplifier; or
the high pass filter is connected between the amplifier and the level detector.

3. The bridge driver of claim 1, comprising:
a low side input terminal; and
a low side driver connected to the low side input terminal and configured to generate a low side output signal based on a low side input signal received at the low side input terminal, wherein:
the transmitter and the low side driver are in a low voltage domain and the receiver and the high side driver are in a high voltage domain.

4. The bridge driver of claim 1, wherein:
the amplifier comprises a bandpass amplifier.

5. The bridge driver of claim 1, wherein:
the isolation circuit comprises:
  a first isolation capacitor connected to receive the positive differential component;
  a second isolation capacitor connected to receive the negative differential component;
  a first resistor connected to the first isolation capacitor;
  a second resistor connected to the second isolation capacitor and the first resistor; and
  a reference voltage source connected to a node between the first resistor and the second resistor.

6. The bridge driver of claim 1, wherein:
the high pass filter comprises:
  a first isolation capacitor;
  a second isolation capacitor;
  a first resistor connected to the first isolation capacitor;
  a second resistor connected to the second isolation capacitor and the first resistor; and
  a reference voltage source connected to a node between the first resistor and the second resistor.

7. The bridge driver of claim 1, wherein:
the level detector comprises:
  a level shifter circuit; and
  a detector circuit connected to the level shifter circuit.

8. The bridge driver of claim 1, wherein:
the transmitter is configured to generate the modulated signal using on-off keying modulation.

9. A receiver, comprising:
a positive terminal;
a negative terminal;
a first isolation capacitor connected to the positive terminal;
a second isolation capacitor connected to the negative terminal;
a resistor circuit connected to the first isolation capacitor and the second isolation capacitor to define a first high pass filter;
an amplifier connected to the first high pass filter;
a level detector connected to the amplifier; and
a second high pass filter connected between the first high pass filter and the level detector.

10. The receiver of claim 9, wherein:
the second high pass filter is connected between the first high pass filter and the amplifier; or
the second high pass filter is connected between the amplifier and the level detector.

11. The receiver of claim 9, wherein:
the resistor circuit comprises:
  a first resistor connected to the first isolation capacitor; and
  a second resistor connected between the second isolation capacitor and the first resistor.

12. The receiver of claim 11, wherein:
the resistor circuit comprises:
  a reference voltage source connected to a node between the first resistor and the second resistor.

13. The receiver of claim 9, wherein:
the amplifier comprises a bandpass amplifier.

14. The receiver of claim 9, wherein:
the second high pass filter comprises:
  a third isolation capacitor;
  a fourth isolation capacitor;
  a first resistor connected to the third isolation capacitor;
  a second resistor connected between the fourth isolation capacitor and the first resistor; and
  a reference voltage source connected to a node between the first resistor and the second resistor.

15. The receiver of claim 9, wherein:
the level detector comprises:
  a level shifter circuit; and
  a detector circuit connected to the level shifter circuit.

16. A method, comprising:
  generating a modulated signal based on a high side input signal, the modulated signal comprising a positive differential component and a negative differential component;
  receiving the positive differential component at a first isolation capacitor;
  receiving the negative differential component at a second isolation capacitor;
  filtering, in a first high pass filter defined by a resistor circuit connected to the first isolation capacitor and the second isolation capacitor, the positive differential component and the negative differential component to generate a first filtered positive differential component and a first filtered negative differential component;
  filtering, in a second high pass filter, the first filtered positive differential component and the first filtered negative differential component to generate a second filtered positive differential component and a second filtered negative differential component;
  generating, in a level detector, a driver signal based on the second filtered positive differential component and the second filtered negative differential component; and
  generating, in a high side driver, a high side output signal based on the driver signal.

17. The method of claim 16, comprising:
  amplifying the first filtered positive differential component and the first filtered negative differential component to generate an amplified positive differential component and an amplified negative differential component, wherein:
    filtering, in the second high pass filter, comprises:
      filtering the amplified positive differential component and the amplified negative differential component to generate the second filtered positive differential component and the second filtered negative differential component.

18. The method of claim 16, comprising:
  amplifying the second filtered positive differential component and the second filtered negative differential component prior to generating the driver signal.

19. The method of claim 16, comprising:
  providing the resistor circuit comprising:
    a first resistor connected to the first isolation capacitor;
    a second resistor connected to the second isolation capacitor and the first resistor; and
    a reference voltage source connected to a node between the first resistor and the second resistor.

20. The method of claim 16, comprising:
  providing the second high pass filter comprising:
    a third isolation capacitor connected to the first isolation capacitor;
    a first resistor connected to the third isolation capacitor;
    a fourth isolation capacitor connected to the second isolation capacitor;
    a second resistor connected to the fourth isolation capacitor and the first resistor; and
    a reference voltage source connected to a node between the first resistor and the second resistor.

* * * * *